United States Patent
Personne

(10) Patent No.: US 11,576,258 B2
(45) Date of Patent: Feb. 7, 2023

(54) METHOD FOR PRODUCING A SEALED ELECTRICAL CONNECTION IN A CERAMIC CASE AND IMAGE-INTENSIFIER TUBE COMPRISING SUCH A CASE

(71) Applicant: PHOTONIS FRANCE, Brive (FR)

(72) Inventor: Stéphane Personne, Noailles (FR)

(73) Assignee: PHOTONIS FRANCE, Brive (FR)

(*) Notice: Subject to any disclaimer, the term of this patent is extended or adjusted under 35 U.S.C. 154(b) by 294 days.

(21) Appl. No.: 16/761,121

(22) PCT Filed: Nov. 6, 2018

(86) PCT No.: PCT/FR2018/052732
§ 371 (c)(1),
(2) Date: May 1, 2020

(87) PCT Pub. No.: WO2019/092353
PCT Pub. Date: May 16, 2019

(65) Prior Publication Data
US 2020/0275551 A1    Aug. 27, 2020

(30) Foreign Application Priority Data
Nov. 8, 2017  (FR) ...................... 1760475

(51) Int. Cl.
*H05K 3/40* (2006.01)
*H05K 1/03* (2006.01)

(52) U.S. Cl.
CPC ......... *H05K 1/0306* (2013.01); *H05K 3/4046* (2013.01); *H01J 2231/5016* (2013.01)

(58) Field of Classification Search
CPC .. H05K 1/0306; H05K 3/4046; H05K 3/4076; H05K 3/4038; H05K 2201/09572;
(Continued)

(56) References Cited

U.S. PATENT DOCUMENTS 4,727,633 A    3/1988   Herrick
6,483,231 B1*  11/2002  Iosue .................... H01J 43/246
                                                        313/530
(Continued)

FOREIGN PATENT DOCUMENTS

FR   2677808 A1    12/1992
WO   2009/074682 A2   6/2009

OTHER PUBLICATIONS

International Search Report for PCT/FR2018/052732 dated Jan. 30, 2019.
(Continued)

*Primary Examiner* — Donghai D Nguyen
(74) *Attorney, Agent, or Firm* — Pearne & Gordon LLP

(57) ABSTRACT

A method of making leak tight electrical connections through the wall of a ceramic package, for example a ceramic package used on an image intensifier tube. The method comprises a hole metallisation step (500) to obtain vias, the metallisation step comprising the deposition of a bond layer (510), a diffusion barrier (520) acting as a metallic base layer and a wetting agent (530). For each via, a filler metal preform made of indium or a eutectic chosen from among InSn, AuSn, AuGe, AgSn is deposited (540) on each orifice and is heated to a temperature higher than its melting temperature (550) such that the molten filler metal closes off the via to make it leak tight.

9 Claims, 5 Drawing Sheets

(58) Field of Classification Search
CPC ........... Y10T 29/49144; Y10T 29/4913; Y10T 29/49155; Y10T 29/49165; H01J 2231/5016; H01J 31/507
USPC .................................. 29/832, 840, 846, 852
See application file for complete search history.

(56) References Cited

U.S. PATENT DOCUMENTS

| | | | |
|---|---|---|---|
| 8,138,428 B2* | 3/2012 | Maeda ................. | H05K 3/3452 174/262 |
| 8,987,671 B2 | 3/2015 | Nutzel et al. | |
| 9,773,751 B1* | 9/2017 | Knickerbocker .... | H05K 3/4038 |
| 2017/0217767 A1 | 8/2017 | Gudeman et al. | |

OTHER PUBLICATIONS

WrittenOpinion for PCT/FR2018/052732 dated Jan. 30, 2019.
Preliminary French Search Report for FR1760475 dated Jul. 18, 2018.

\* cited by examiner

METHOD FOR PRODUCING A SEALED ELECTRICAL CONNECTION IN A CERAMIC CASE AND IMAGE-INTENSIFIER TUBE COMPRISING SUCH A CASE

CROSS-REFERENCE TO RELATED APPLICATIONS

This is a National Stage application of PCT international application PCT/FR2018/052732, filed on Nov. 6, 2018, which claims the priority of French Patent Application No. 1760475, filed Nov. 8, 2017, both of which are incorporated herein by reference in their entirety.

DESCRIPTION

Technical Domain

This invention relates to the field of fabrication of image intensifying tubes. It has applications particularly in night vision systems.

State of Prior Art

A night vision system uses an image intensifying device capable of making a dark environment perceptible to an observer. More precisely, the image intensifying device collects radiation emitted by the environment, particularly the small quantity of visible light and infrared radiation, and amplifies it so as to deliver an image of the environment that can be perceived by the human eye at the output. The light signal at the output from the image intensifying device can be recorded by a recording device, displayed on an external monitor or can be observed directly by an observer. In the latter case, image intensifying devices are used in night vision goggles or binoculars worn on the head by a person so as to transmit the output light signal directly to the person's eyes. The objective is then normally to have a compact and lightweight night vision system.

A compact image intensifying tube has been disclosed in international patent application WO-A-2009/074682 deposited in the name of this Applicant.

This image intensifying tube, 100, is illustrated in FIG. 1. It comprises essentially a ceramic package 110, forming the tube body, with an approximately annular shape. The body of the tube with axis AA is closed at one of its ends by an entry window 120 and at the opposite end by an exit window 130. The entry window is generally made of glass and comprises an inner face on which the photo emission layer of a photocathode 125 is deposited. The exit window is also generally made of glass (for example a bundle of optical fibres) and comprises an internal face on which a phosphorus screen 135 is deposited.

A micro-channel plate or MCP 140, is located between the entry window and the exit window and rests an internal edge of the ceramic housing 110. It has an entry face parallel to the photocathode and an exit face parallel to the phosphor screen.

Incident photons on the entry face result in the generation of photoelectrons in the photocathode, provided that they have sufficiently high energy. These photoelectrons thus emitted are accelerated by an electrostatic field to the MCP in which they are multiplied to give secondary electrons. Secondary electrons at the exit from the MCP are accelerated by the electrostatic field and reach the phosphor screen 135 where they can generate photons, provided that they have sufficient energy. Photons are transmitted outside the tube through the exit window or via the optical fibre.

The special feature of this intensifying tube lies in production of the ceramic package. This is composed of a multilayer ceramic substrate to position the MCP at a small distance from the photocathode. Metallic tracks (not represented) planned within the multilayer ceramic substrate make it possible to connect the MCP to external contact pins 150 and thus to polarise it positively relative to the photocathode.

Entry and exit windows are bonded onto the ceramic package to make the assembly leak tight and to maintain the vacuum inside the tube. The bond on the entry window is made by means of an InSn seal, 141, and the bond on the exit window is made by means of an indium seal, 142. Furthermore, the MCP is held on the annular tube body by bonding using indium microballs.

Finally, a spacer, 141, located between the top face of the ceramic package and the entry window guarantees a predetermined distance between the inside face of the photocathode and the entry face of the MCP.

However, this image intensifying tube, although significantly more compact than traditional tubes, has a number of limitations.

Firstly, the mechanical strength of the tube is not optimal due to the presence of the ceramic spacer between the entry window and the annular package. The package can move when an impact occurs and can lead to geometric positioning defects of the MCP relative to the photocathode (particularly parallelism defects, failure to respect the set distance between the MCP and the photocathode), that can be prejudicial to the uniformity of the pulse response, in other words uniformity of the Modulation Transfer Function (MTF), and can degrade the resolution of the intensified image.

Furthermore, the metallic tracks of the multilayer ceramic substrate that connect the electrodes of the MCP at external contact pins can lead to leak tightness defects in the ceramic package and a shorter tube life.

Consequently, the purpose of this invention is to overcome the above-mentioned disadvantages and to disclose a method of manufacturing leak tight electrical connections in a ceramic package, particularly for an image intensifying tube. A second purpose of this invention is to disclose a leak tight ceramic package to provide mechanical strength of the tube and to maintain the geometric position of the MCP relative to the entry window.

PRESENTATION OF THE INVENTION

This invention is defined by a method of manufacturing a leak tight electrical connection through the wall of a ceramic package, particularly a ceramic package of an image intensifying tube, the ceramic package being provided with a hole opening up on an internal surface of the package through a first orifice and on an outside surface of the package through a second orifice, the method comprising the following steps:

the hole is metallised to obtain a via, by successively depositing a metallic bond layer, a diffusion barrier and a wetting agent layer;

a portion of filler metal made of indium or a eutectic chosen from among AuSn, AuGe, AgSn, InSn is deposited on each of the first and second orifices;

said portion of filler metal is melted, the molten filler metal closing off the via so as to make it leak tight.

Advantageously, the bond layer is composed of a metal chosen from among tungsten, molybdenum, titanium and chromium.

The diffusion barrier is preferably made from a metal chosen from among nickel, chromium, a nickel-chromium alloy and platinum.

The layer of wetting agent is advantageously made of gold or silver.

Preferably, the AuSn eutectic is composed of 80% gold and 20% tin, the AuGe eutectic is composed of 88% gold and 12% germanium, the AgSn eutectic is composed of 96.5% tin and 3.5% silver, the InSn eutectic is composed of 52% of indium and 48% tin, the percentages being by mass.

The invention also relates to an image intensifier tube comprising a ceramic package forming the tube body, an entry window on the inside face of which is deposited a photocathode and closing the tube at a first end, an exit window on the internal face of which is deposited a phosphor screen, a micro-channel plate called MCP, located on a shoulder of the ceramic package, the ceramic package being provided with electrical connections passing through its wall and connecting electrodes of the MCP with external contact pins, the electrical connections being made using the method described above.

Advantageously, the ceramic package comprises a vertical annular stop on its top part, said stop being an integral part of the ceramic package, the inside face of the entry window resting on this stop when it is bonded on the package, said stop fixing a predetermined distance between the photocathode and the top face of the MCP.

The entry window and the exit window can be bonded on the ceramic package using seals made of indium or a eutectic material chosen from among InSn with 52% indium and 48% tin, AuSn with 80% gold and 20% tin, AuGe with 88% gold and 12% germanium and AgSn with 96.5% tin and 3.5% silver, the percentages being by mass.

Advantageously, the ceramic package is made by injection moulding of ceramic particles followed by sintering.

BRIEF DESCRIPTION OF THE DRAWINGS

Other characteristics and advantages of the invention will become clear after reading a preferred embodiment of the invention, given with reference to the appended figures among which.

DETAILED PRESENTATION OF A PREFERRED EMBODIMENT

Figure 1:
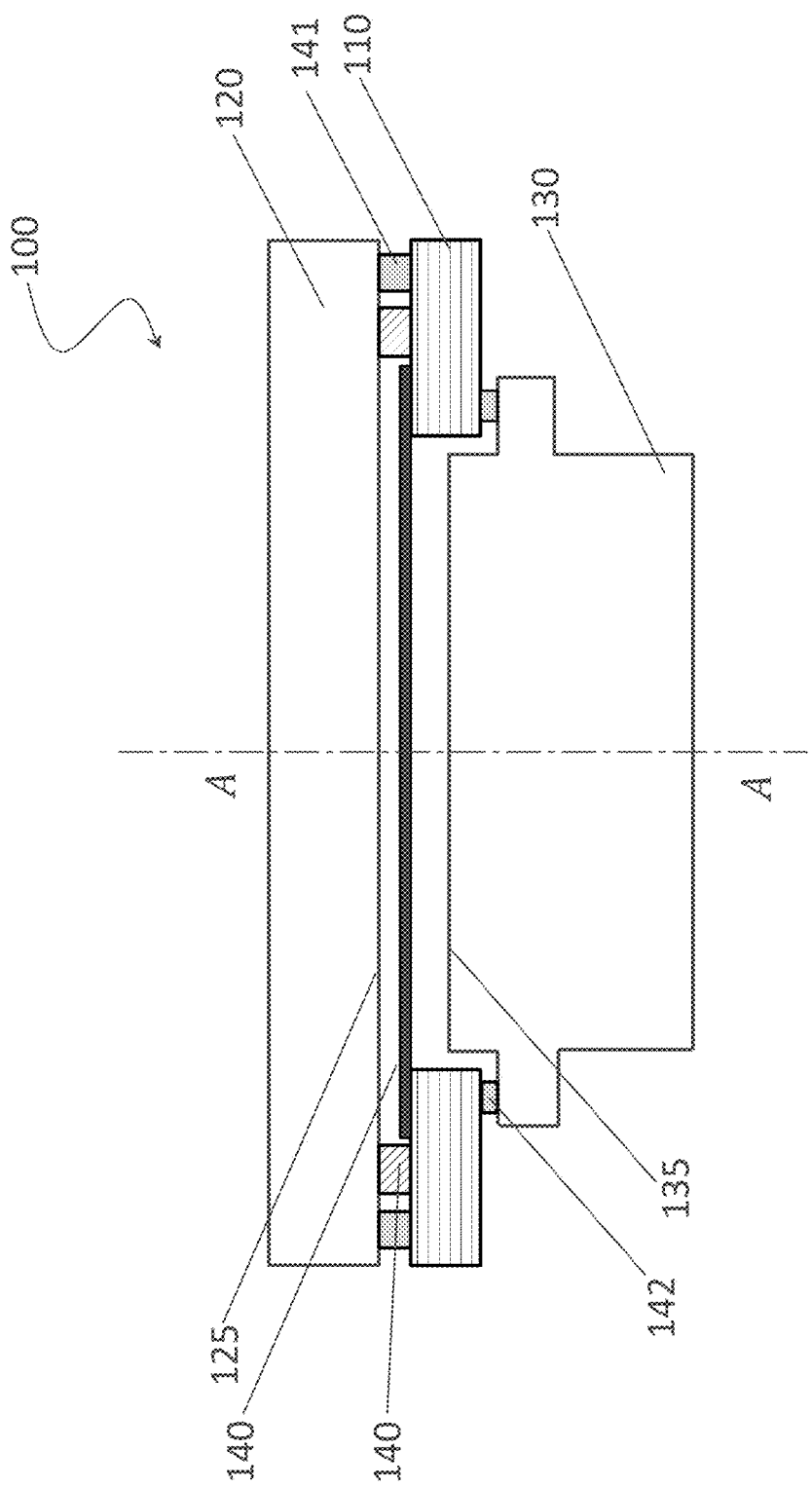
FIG. 1, already described, is a vertical sectional view of the structure of an image intensifier tube known in prior art.
Figure 2:
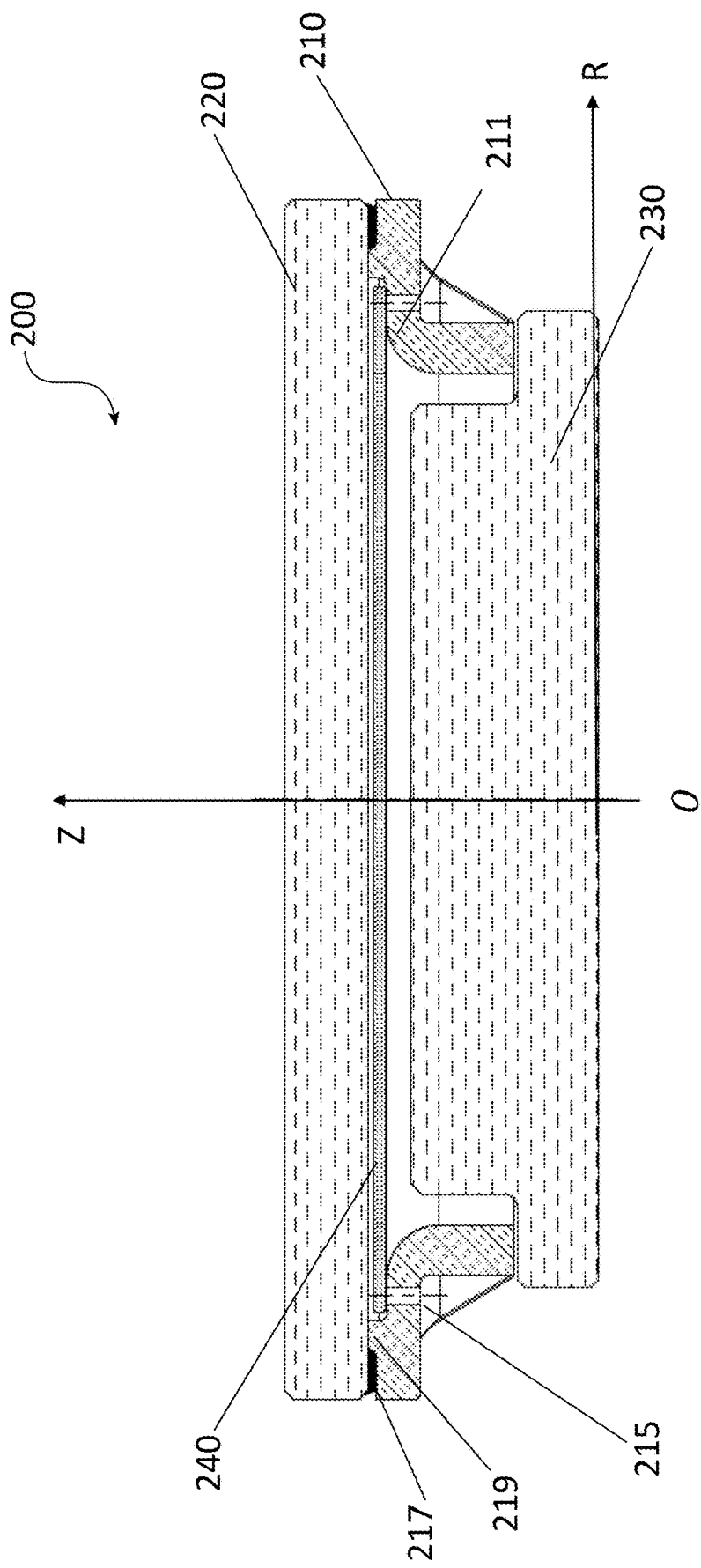
FIG. 2, already described, is a vertical sectional view of the structure of an image intensifier tube according to one embodiment of the invention.

FIG. 2 represents a sectional view of an image intensifier tube according to one embodiment of the invention.

As in prior art described above, the image intensifier tube, 200, comprises a ceramic package 210 forming the body of the tube, an entry window 220 on the inside of which is deposited a photocathode, and an exit window, and an outlet window, 230 on the inside face of which a phosphor screen is deposited.

The inlet and outlet windows are generally made in the form of glass bricks. The external face of the exit window can be connected to a bundle of optical fibres to transfer the intensified image.

The tube 200 has an essentially cylindrical shape along a OZ optical axis. Alternatively, the tube 200 can have a shape whose cross-section is square, rectangular, hexagonal, or another shape. A coordinate system (R, Z) is represented in which R is the radial direction of the tube and Z is the axial direction du tube, parallel to the OZ optical axis, oriented in the inverse direction of propagation of photons and electrons inside the tube 200. With this convention, the upper part of the tube is composed of the entry window and the lower part of the tube is composed of the exit window.

A micro-channel plate or MCP, 240, is supported on a shoulder, 211, of the ceramic package facing the photocathode, the entry window resting on a vertical stop, 219, forming an integral part of the ceramic package and overhanging this shoulder. The distance between the photoemissive layer of the photocathode and the entry surface of the MCP is entirely determined by the geometry of the ceramic package, and more precisely by the height of the stop relative to the shoulder and by the thickness of the MCP. Integration of a vertical stop into the ceramic package provides a means of forming a monolithic assembly and reducing the number of elements in the tube, and it improves its stiffness and also the extent to which geometric constraints are respected.

Vertical electrical connections 215 are provided in the shoulder of the ceramic package so that electrodes of the MCP can be connected to the external contact pins (not shown).

The entry window 220 is bonded so as to be leak tight on an annular surface 217 of the upper part of the ceramic package, for example by means of a bonding seal made of indium, in a manner known in itself. The exit window is sealed in the same way on the ceramic package.

As an alternative to indium, the bonding seal can be composed of a eutectic material with a high melting point chosen from among InSn with 52% indium and 48% tin, AuSn with 80% gold and 20% tin, AuGe with 88% gold and 12% germanium and AgSn with 96.5% tin and 3.5% silver, the percentages being by mass.

The ceramic package may be made using a Ceramic Injection Moulding (CIM) technique. This technique consists of injecting a raw material composed of organic materials with a high content of fine ceramic particles into a mould and creating a high temperature and high pressure in the mould. After moulding, the organic binders are eliminated by dissolution in a solvent, followed by heat treatment. The product thus obtained can then be sintered or co-sintered.

This injection moulding followed by sintering can give complex geometric shapes with a significantly higher precision than that obtained by sintering layers. In other words, the ceramic package thus made is better defined geometrically and can respect stricter dimensional tolerances than is possible with a multilayer ceramic package according to prior art. Thus, parallelism and distance constraints between the photocathode and the MCP, dependent on the geometry of the ceramic package, are better respected.

Figure 3:
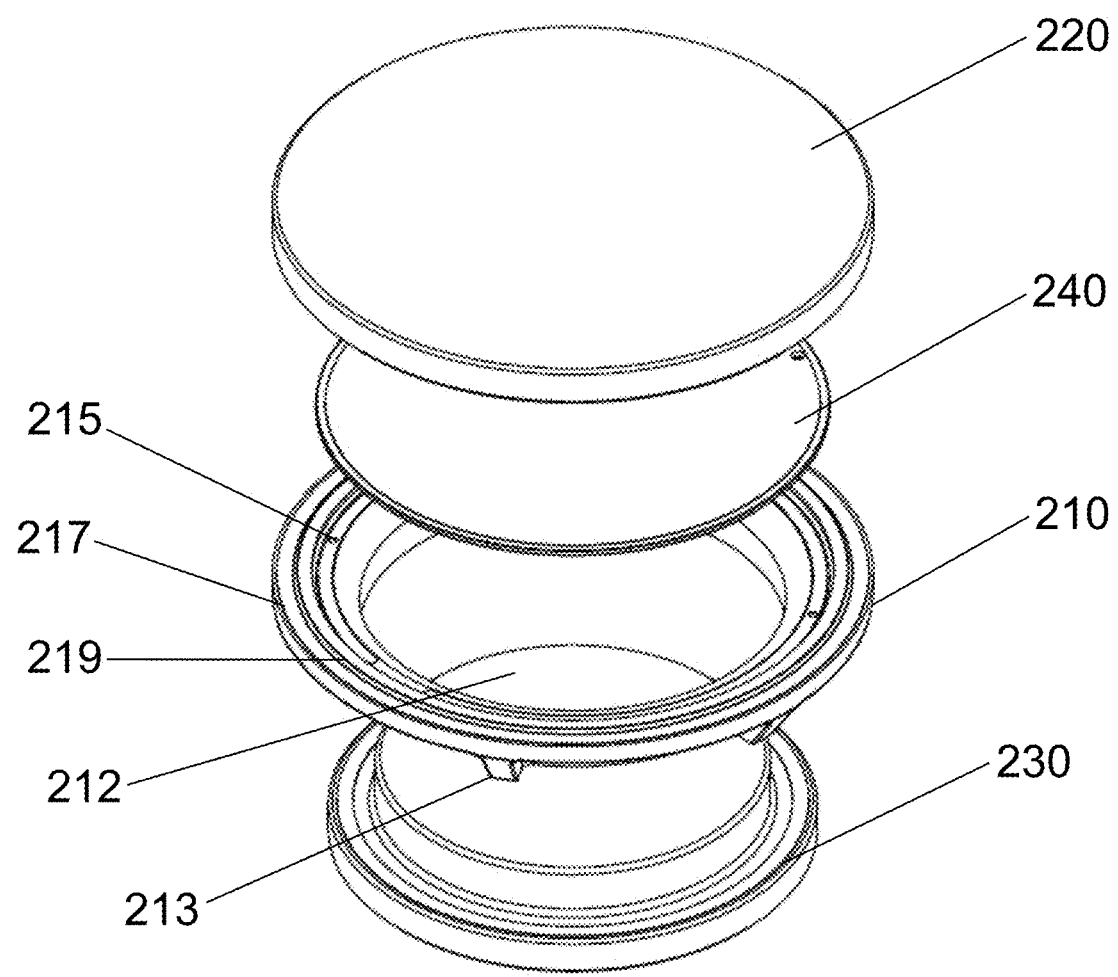
FIG. 3 represents an exploded view of the structure of the image intensifier tube in FIG. 2.

FIG. 3 represents an exploded view of the image intensifier tube in FIG. 2.

The figure shows the ceramic package 210 on which the MCP 240 and the entry window 220 are supported, the other end of the package being closed by the exit window 230.

The ceramic package 210 is annular in shape with a central recess 212 delimiting the active area of the intensifier tube. The profile of the upper part of the package comprises, working from the centre towards the periphery of the package, the annular shoulder on which the MCP is supported, the annular stop 219 on which the entry window is supported, and the annular peripheral surface 210 onto which the entry window is bonded.

Figure 4:
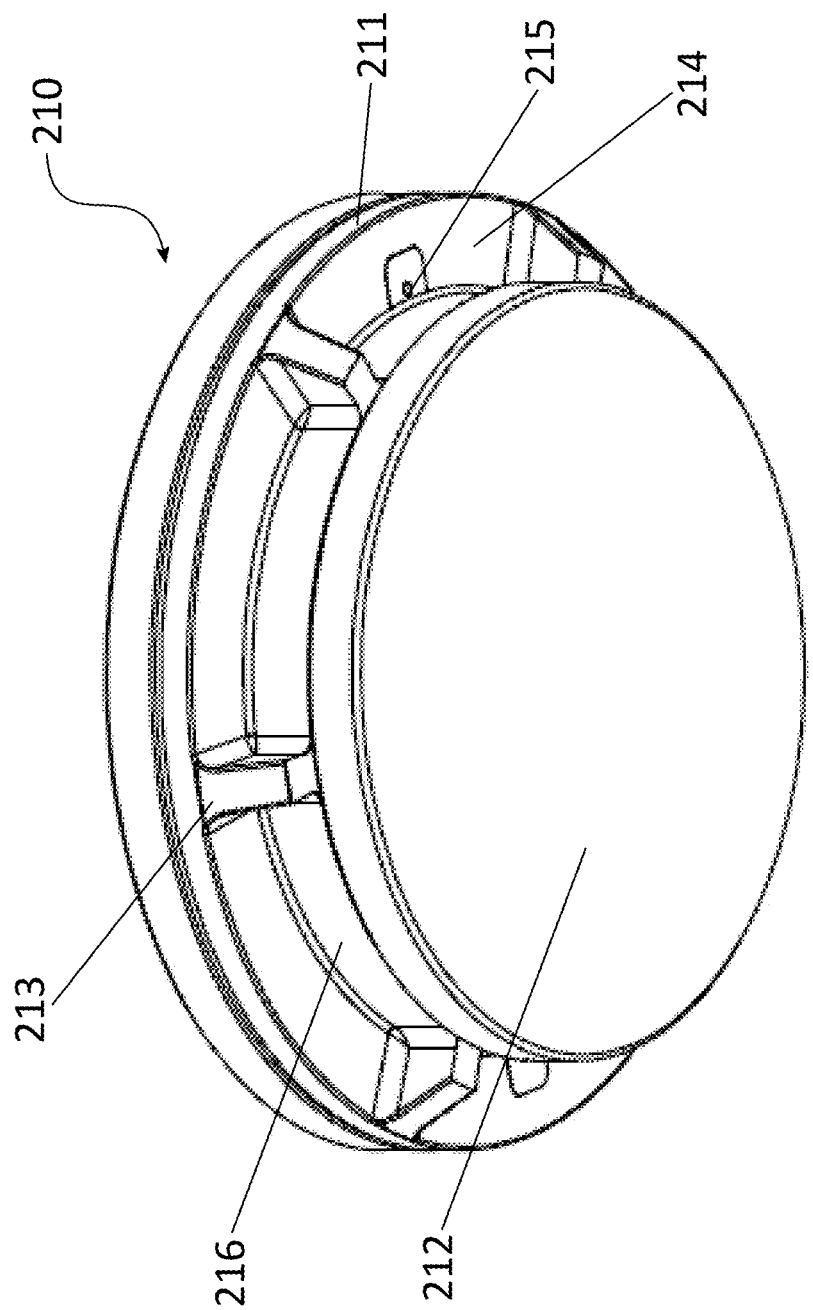
FIG. 4 represents a ceramic package used in the structure intensifier tube in FIG. 2.

FIG. 4 represents the detail of the ceramic package, 210.

The shoulder 211 supported by an annular base 216 can be seen in a bottom view, the shoulder and the annular base being connected by ribs 213 extending radially starting from the annular base. The inside of the annular base defines the central recess 212. Vias 215 pass through the shoulder 211 and open up on its lower surface 214. These vias are closed off at their two ends by a metal or a metallic eutectic as explained below.

The vias thus closed off make the electrical connections between the electrodes of the MCP and the external contact pins, while guaranteeing that the tube is leak tight. There are at least two electrodes of the MCP, one electrode being connected to the upper face and one electrode being connected to the lower face, which requires the presence of at least two vias in the shoulder. Obviously, there may be more than two vias, particularly if the electrodes are segmented.

Figure 5:
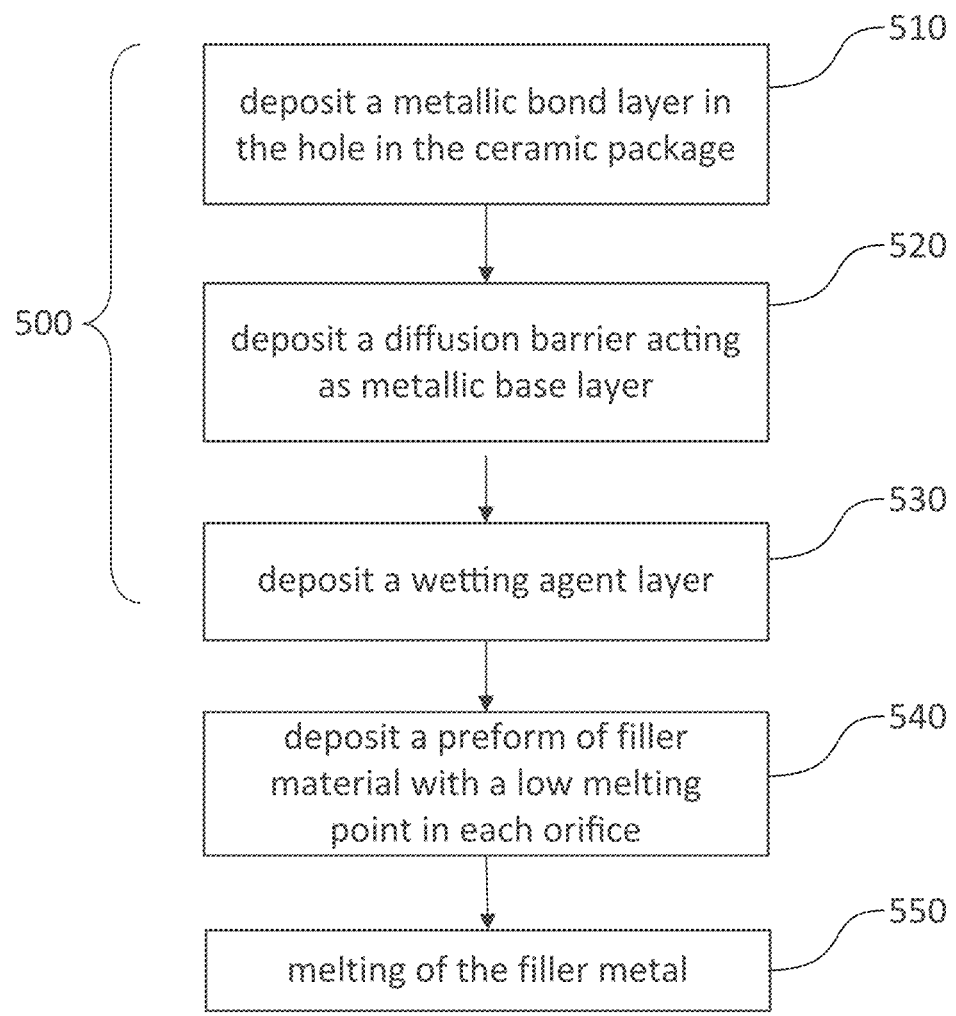
FIG. 5 diagrammatically illustrates a method of making leak tight electrical connections in a ceramic package according to one embodiment of the invention.

The electrical connections are generally obtained as described below with reference to FIG. 5.

The method of making electrical connections is applicable to the unfinished ceramic package, simply provided with holes. These holes pass through the shoulder and open up on its upper face and its lower face.

The method comprises three steps 500, 540 and 550.

The first step is a metallisation step done by physical vapour deposition (PVD), chemical vapour deposition (CVD), cathodic sputtering, or electrolytic deposit.

This first step comprises a first sub-step 510 consisting of depositing a metallic bond layer on the inner surface of the hole. The function of the bond layer is to bond to the ceramic surface (formation of a ceramo-metallic bond) so that the upper layers can bond to this bond layer in turn. The metal of the bond layer will advantageously be chosen from among tungsten (W), molybdenum (Mo), titanium (Ti) and chromium (Cr).

A second metallic layer called the diffusion barrier is then deposited directly, 520, on the bond layer. The function of this layer is to prevent migration of metal from upper layers to the ceramic such that the interface between the bond layer and the ceramic is not damaged. The metal in the diffusion barrier will advantageously be chosen from among nickel (Ni), chromium (Cr), a nickel chromium (NiCr) alloy, or platinum (Pt). This layer will also act as the base metallic layer.

Finally, in 530, a thin Au or Ag layer providing protection against oxidation is deposited, that acts as wetting agent in the subsequent melting step.

After deposition of the wetting agent layer, a filler metal is deposited in 540 on the wetting agent layer, for example in the form of a ball, a land, a portion of ribbon or more generally any preform. This preform is placed so as to close off the metallised hole of via.

The filler metal can be indium or a eutectic chosen from among AuSn with 80% gold and 20% tin, AuGe with 88% gold and 12% germanium, AgSn with 96.5% tin and 3.5% of silver, InSn with 52% indium and 48% tin, the percentages all being by mass.

The filler metal preform is then heated to melting temperature. The molten filler metal covers the metallic base layer due to the wetting agent deposited on the metallic base layer and migrates to the diffusion barrier. The molten metal obstructs the via and makes it leak tight as it solidifies.

What is claimed is:

1. Method of manufacturing a leak tight electrical connection through a wall of a ceramic package of an image intensifying tube, the ceramic package being provided with a hole opening up on an internal surface of the package through a first orifice and on an outside surface of the package through a second orifice, the method comprising:
   metallizing the hole to obtain a via, by successively depositing a metallic bond layer, a diffusion barrier and a wetting agent layer;
   depositing a portion of filler metal made of indium or a eutectic chosen from among AuSn, AuGe, AgSn, InSn on each of the first and second orifices;
   melting said portion of filler metal, the molten filler metal closing off the via so as to make the via leak tight.

2. The method of making a leak tight electrical connection though the wall of a ceramic package according to claim 1, wherein the bond layer is composed of a metal chosen from among tungsten, molybdenum, titanium and chromium.

3. The method of making a leak tight electrical connection though the wall of a ceramic package according to claim 1, wherein the diffusion layer is made from a metal chosen from among nickel, chromium, a nickel-chromium alloy and platinum.

4. The method of making a leak tight electrical connection though the wall of a ceramic package according to claim 1, wherein the wetting agent layer is made of gold or silver.

5. The method of making a leak tight electrical connection though the wall of a ceramic package according to claim 1, wherein the AuSn eutectic is composed of 80% gold and 20% tin, the AuGe eutectic is composed of 88% gold and 12% germanium, the AgSn eutectic is composed of 96.5% tin and 3.5% silver, the InSn eutectic is composed of 52% of indium and 48% tin, the percentages being by mass.

6. Image intensifier tube comprising a ceramic package forming the tube body, an entry window on the inside face of which is deposited a photocathode and closing the tube at a first end, an exit window on the internal face of which is deposited a phosphor screen, a micro-channel plate called MCP, located on a shoulder of the ceramic package, the ceramic package being provided with electrical connections passing through a wall of the ceramic package and connecting electrodes of the MCP with external contact pins, wherein the electrical connections are made using the method in claim 1.

7. The image intensifier tube according to claim 6, wherein the ceramic package comprises a vertical annular stop on a top part of the ceramic package, said stop being an integral part of the ceramic package, the inside face of the entry window resting on this stop when the entry window is bonded on the package, said stop fixing a predetermined distance between the photocathode and the top face of the MCP.

8. The image intensifier tube according to claim 6, wherein the entry window and the exit window are bonded on the ceramic package using seals made of indium or a eutectic material chosen from among InSn with 52% indium and 48% tin, AuSn with 80% gold and 20% tin, AuGe with 88% gold and 12% germanium and AgSn with 96.5% tin and 3.5% silver, the percentages being by mass.

9. The intensifier tube according to claim 6, wherein the ceramic package is made by injection moulding of ceramic particles followed by sintering.

* * * * *